United States Patent
Gu et al.

(10) Patent No.: US 7,098,515 B1
(45) Date of Patent: Aug. 29, 2006

(54) SEMICONDUCTOR CHIP WITH BORDERLESS CONTACT THAT AVOIDS WELL LEAKAGE

(75) Inventors: Shioun Gu, Vancouver, WA (US); Derryl J. Allman, Camas, WA (US); Peter McGrath, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/104,050

(22) Filed: Apr. 11, 2005

Related U.S. Application Data

(63) Continuation of application No. 10/360,746, filed on Feb. 5, 2003, now Pat. No. 6,893,937, which is a continuation of application No. 10/006,540, filed on Nov. 30, 2001, now Pat. No. 6,551,901.

(60) Provisional application No. 60/314,148, filed on Aug. 21, 2001.

(51) Int. Cl.
*H01L 23/52* (2006.01)

(52) U.S. Cl. ............ 257/397; 257/513; 257/637; 257/774

(58) Field of Classification Search ......... 257/513
See application file for complete search history.

(56) References Cited

U.S. PATENT DOCUMENTS

| | | | |
|---|---|---|---|
| 5,912,188 A | 6/1999 | Gardner et al. | |
| 5,913,139 A | 6/1999 | Hashimoto et al. | |
| 6,114,734 A | 9/2000 | Eklund | |
| 6,130,482 A | 10/2000 | Iio et al. | |
| 6,228,777 B1 * | 5/2001 | Arafa et al. | 438/740 |
| 6,281,562 B1 | 8/2001 | Segawa et al. | |
| 6,287,951 B1 | 9/2001 | Lucas et al. | |
| 6,294,823 B1 * | 9/2001 | Arafa et al. | 257/510 |
| 6,335,279 B1 | 1/2002 | Jung et al. | |
| 6,339,003 B1 | 1/2002 | Kim | |
| 6,373,119 B1 * | 4/2002 | Noda | 257/510 |
| 6,444,566 B1 | 9/2002 | Tsai et al. | |
| 2001/0019898 A1 | 9/2001 | Arafa et al. | |
| 2002/0072217 A1 | 6/2002 | Tseng et al. | |

OTHER PUBLICATIONS

Stanley Wolf and Richard N. Tauber, "Silicon Processing for the VLSI Era—vol. 1: Process Technology," Lattice Press, Sunset Beach, California (1986) p. 523.

* cited by examiner

*Primary Examiner*—Stephen W. Smoot
(74) *Attorney, Agent, or Firm*—Beyer Weaver & Thomas, LLP

(57) ABSTRACT

An inventive semiconductor chip is provided. Generally, shallow trenches containing field oxide are provided on a substrate. At least one semiconductor device is formed between the shallow trenches. An oxide layer is formed over the at least one semiconductor device and the field oxide. An etch stop layer is formed over the oxide layer. An inter layer dielectric layer is formed over the etch stop layer. At least one contact hole is etched through the inter layer dielectric layer, the etch stop layer and at least partially through the oxide layer. The contact hole is filled with a conductive material.

15 Claims, 11 Drawing Sheets

US 7,098,515 B1

SEMICONDUCTOR CHIP WITH BORDERLESS CONTACT THAT AVOIDS WELL LEAKAGE

RELATED APPLICATIONS

This application is a continuation application of prior application Ser. No. 10/360,746, filed Feb. 05, 2003, which is now U.S. Pat. No. 6,893,937, which is a Continuation application of application Ser. No. 10/006,540, filed Nov. 30, 2001, which is now U.S. Pat. No. 6,551,901, issued Apr. 22, 2003, which claims priority under 35 U.S.C. 119(e) of the U.S. Provisional Application No. 60/314,148, entitled "PROCESS ENHANCEMENT TO PREVENT LI OR BORDERLESS CONTACT TO WELL LEAKAGE", fled on Aug. 21, 2001 by inventors Shiqun Gu, Derryl Allman, and Peter McGrath, which is incorporated by reference.

FIELD OF THE INVENTION

The present invention relates generally to the manufacture of semiconductor devices. More specifically, the invention relates to the prevention of contact to well leakage in semiconductor devices.

BACKGROUND OF THE INVENTION

High Density Plasma (HDP) oxide film is used to fill shallow trenches to isolate different transistor regions. The isolation HDP oxide filled regions are referred to as Field Oxide (FOX) for providing Shallow Trench Isolation (STI). To facilitate understanding, FIG. 1 is a flow chart of a prior art process of manufacturing on a semiconductor chip formed by at least one semiconductor device with a borderless contact using STI on a substrate. When the space between a contact edge and an active area edge is reduced to zero by design, these contacts are called borderless contacts and local interconnect. FIG. 2 is a schematic cross-sectional view of part of a substrate 204 of a semiconductor chip with field oxides 208 formed to provide Shallow Trench Isolation (STI). A nitride layer 212 is placed over the substrate 204 to provide an etch stop. An oxide layer 216 is placed between the nitride layer 212 and the substrate 204 to prevent damage to the substrate 204 by the nitride layer 212. Such protective oxide layers may be called "pad oxide layers." Generally, a field oxide is deposited and then a Chemical Mechanical Polishing (CMP) is used to polish the surface so that excess FOX is removed, providing a flat surface as shown, using the nitride layer 212 as a stop for the polishing (step 104). The final height of the FOX may be >1000 Å above the substrate surface.

The nitride layer may then be etched away (step 108). Phosphoric acid may be used to remove the nitride layer. Such a wet etching may have a high selectivity between the nitride layer 212, the oxide layer 216, and the FOX 208. FIG. 3 is an illustration of the substrate in FIG. 2 after the nitride layer has been etch away. Due to the high selectivity, minimal amounts of oxide may be removed, providing negative angles 304 at the top of the FOX 208. A Hydrogen Fluoride (HF) wet etch may be used to remove the oxide layer 216, reduce the height of the FOX 208, and change the angle of the FOX 208 at a transistor active edge, by establishing a positive slope 404, as shown in FIG. 4 (step 112). The HF etch effectively moves the edges of the FOX back away from the transistor region.

A semiconductor device may be formed in the transistor region 408 between the FOXs 208 (step 116). An example of such a semiconductor device is illustrated in FIG. 5. In this example, the semiconductor device 504 comprises a source and a drain 508, a gate oxide 516, a polysilicon gate 520, and metal silicides 524 for forming electrical contacts. The process of forming the semiconductor device may expose the FOX 208 to as many as ten wet etches, which may etch away part of the FOX 208 to the point of the top of the FOX 208 that is in contact with the implant areas forming the source and drain 508. Such etchings may cause the edge between the FOX and the transistor to recess as much as 1100 Å.

A Nitride (SiN) layer 530 may be placed over the semiconductor device 504 and substrate 204, forming an etch stop barrier layer and spacers on the sides of the polysilicon gate 520 (step 120). An Inter-Level Dielectric (ILD) layer 540 may be placed over the nitride layer 530 (step 124).

An electrically conductive contact 604 may then be formed in the ILD layer 540, as shown in FIG. 6 (step 128). To form the contact 604, a trench may be etched in the ILD layer 540 and through the nitride layer 530. Such an etch may further etch the FOX 208.

To reduce Integrated Circuit (IC) sizes, current device designs may provide the placement of contacts that may be coincident with the edge of the transistor active region, so that part of the contact may be above the FOX, as shown in FIG. 6. If the FOX 208 has been etched too far, the contact 604 may come into contact with the well region of the substrate 204, which is the region of the substrate below the source or drain 508. Contact between the electrical contact 604 and the well region may cause a short to the well region, which may cause junction leakage.

The amount of FOX loss and recess may be enhanced with a PreGate Nitrogen Implant (PGNI), which may cause the FOX level to be below the transistor junction, causing a short to the well or ground. In addition, the variation in an ILD stack, consisting of both a layer of phosphorus oxide and silicon nitride, combined with plasma etch selectivity on both the type of the feature to be etched and the pattern density of features on a wafer, may result in longer etch time and a higher over etch percentage, to insure that all features are open to the transistor region. This higher percentage of contact (or LI Local Interconnect) over etch may punch deep into the field oxide, causing the final electrical connecting plug to make contact with the well region beneath the junction, causing a short to the wells. The variation of ILD thickness may also be dependent on polysilicon gate density. For ASIC devices, the polysilicon gate density may vary with different devices, making it hard to control ILD thickness, adding to the above-mentioned variation in an ILD stack.

In addition, there may be limitations on the selectivity between PSG and SiN during a PSG etch. There may also be limitations on the selectivity between SiN and FOX during an SiN etch.

It would be desirable to prevent contact between an electrical contact and the well region.

SUMMARY OF THE INVENTION

To achieve the foregoing and in accordance with the purpose of the present invention, a method of forming a semiconductor chip is provided. Generally, shallow trenches containing field oxide are provided on a substrate. At least one semiconductor device is formed between the shallow trenches. An oxide layer is formed over the at least one semiconductor device and the field oxide. An etch stop layer is formed over the oxide layer. An inter layer dielectric layer is formed over the etch stop layer. At least one contact hole is etched through the inter layer dielectric layer, the etch stop layer and at least partially through the oxide layer. The at least one contact hole is filled with a conductive material.

In addition, an inventive semiconductor chip is provided. Generally, shallow trenches containing field oxide are provided on a substrate. At least one semiconductor device is formed between the shallow trenches. An oxide layer is formed over the at least one semiconductor device and the field oxide. An etch stop layer is formed over the oxide layer. An inter layer dielectric layer is formed over the etch stop layer. At least one contact hole is etched through the inter layer dielectric layer, the etch stop layer and at least partially through the oxide layer. The at least one contact hole is filled with a conductive material.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
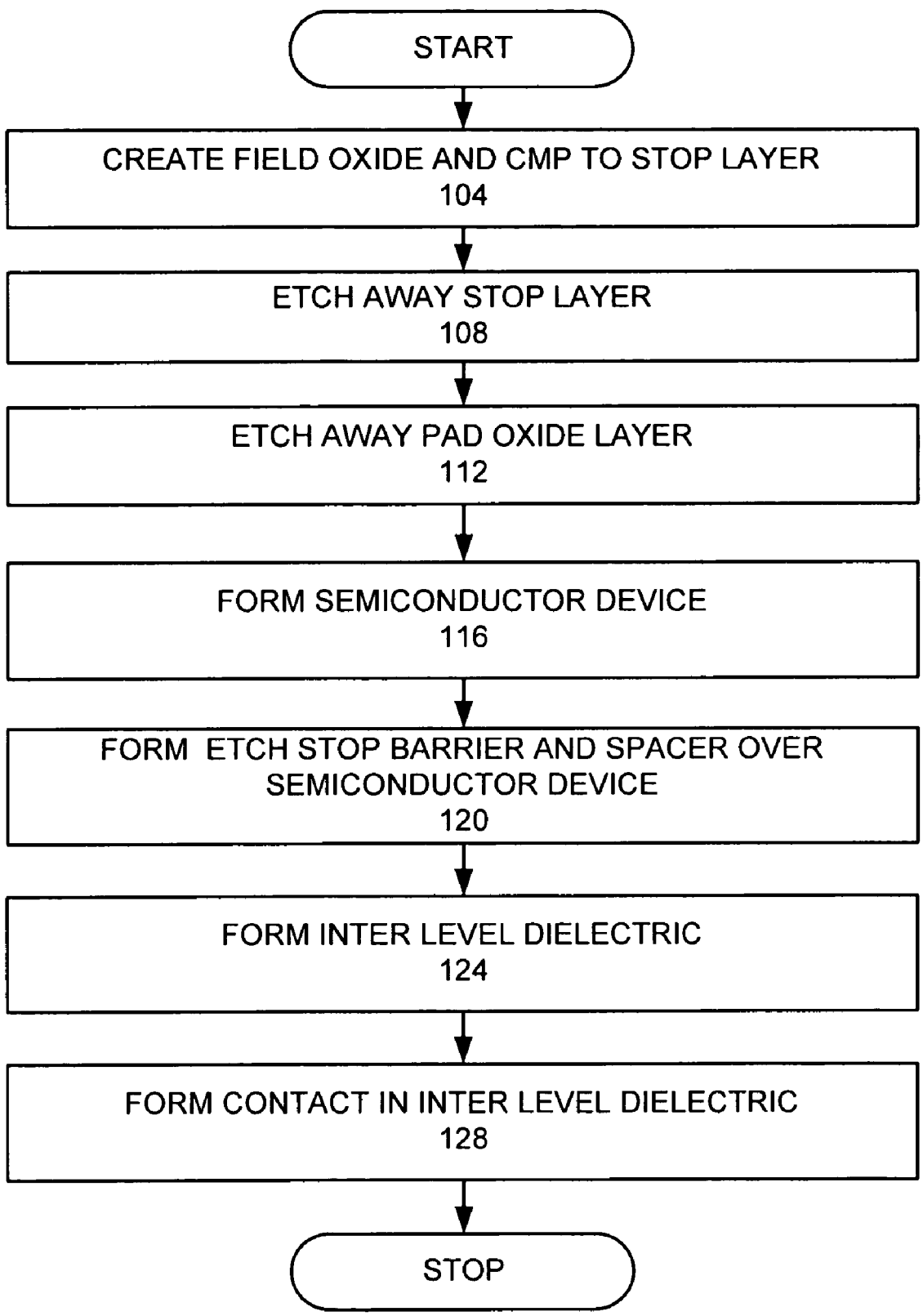
FIG. 1 is a flow chart of a prior art process of manufacturing a semiconductor device with a borderless contact.
Figure 2:
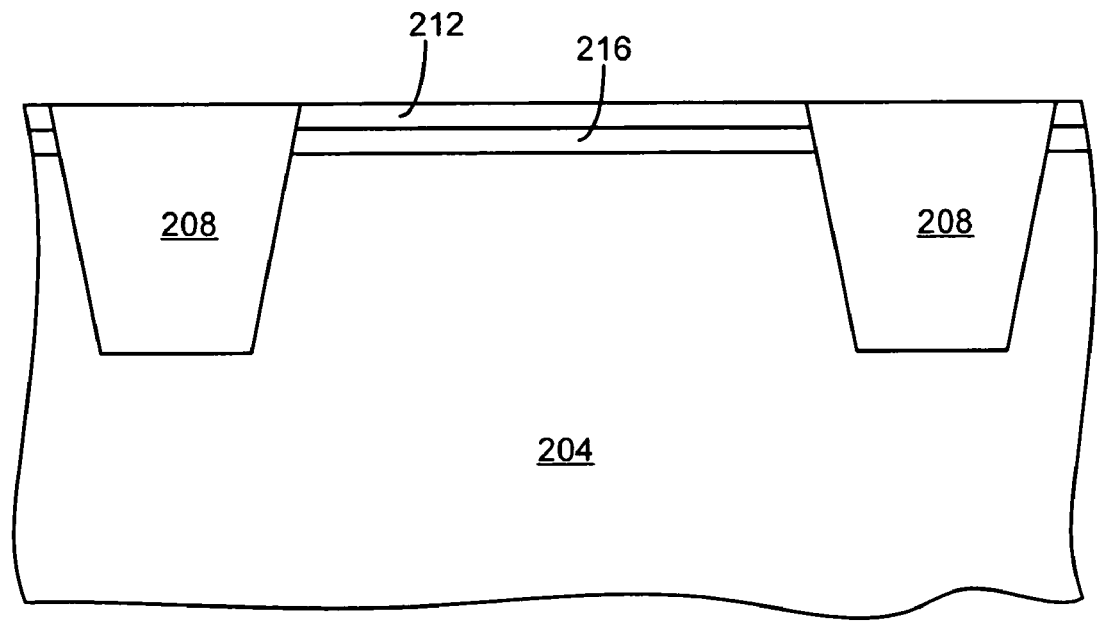
FIG. 2 is a schematic cross-sectional view of part of a substrate for a semiconductor chip with field oxides formed to provide shallow trench isolation in the prior art.
Figure 3:
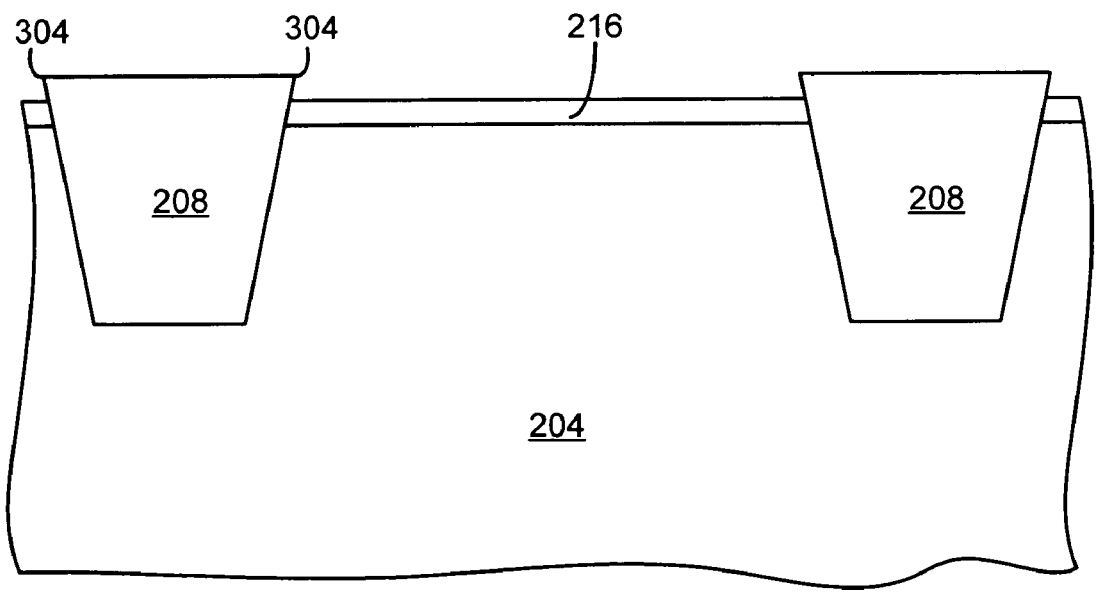
FIG. 3 is a schematic cross-sectional view of the substrate illustrated in FIG. 2 after a nitride layer has been etched away.
Figure 4:
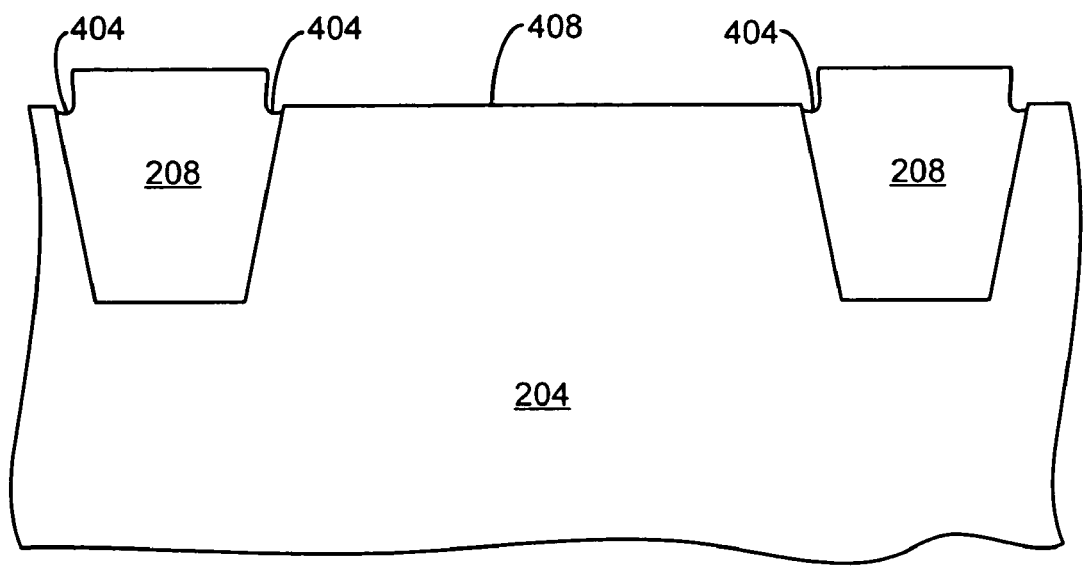
FIG. 4 is a schematic cross-sectional view of the substrate illustrated in FIG. 3 after an oxide layer has been etched away.
Figure 5:
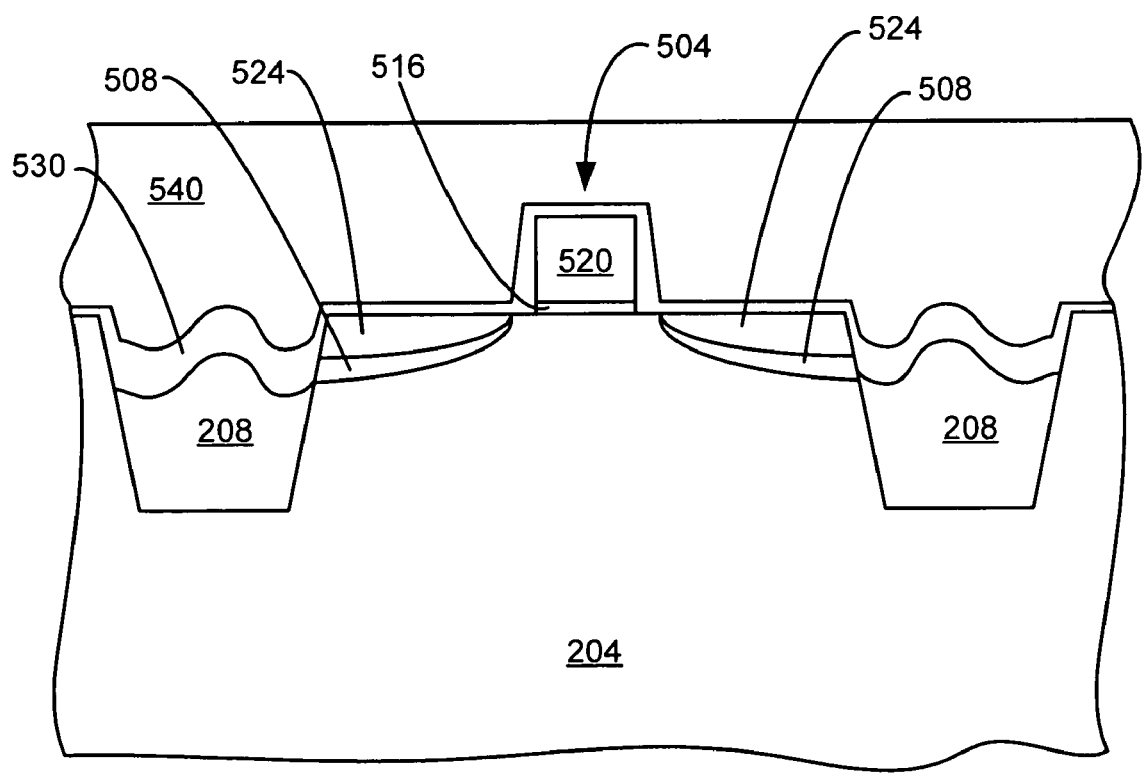
FIG. 5 is a schematic cross-sectional view of the substrate illustrated in FIG. 4 after a semiconductor device has been formed and ILD deposition.
Figure 6:
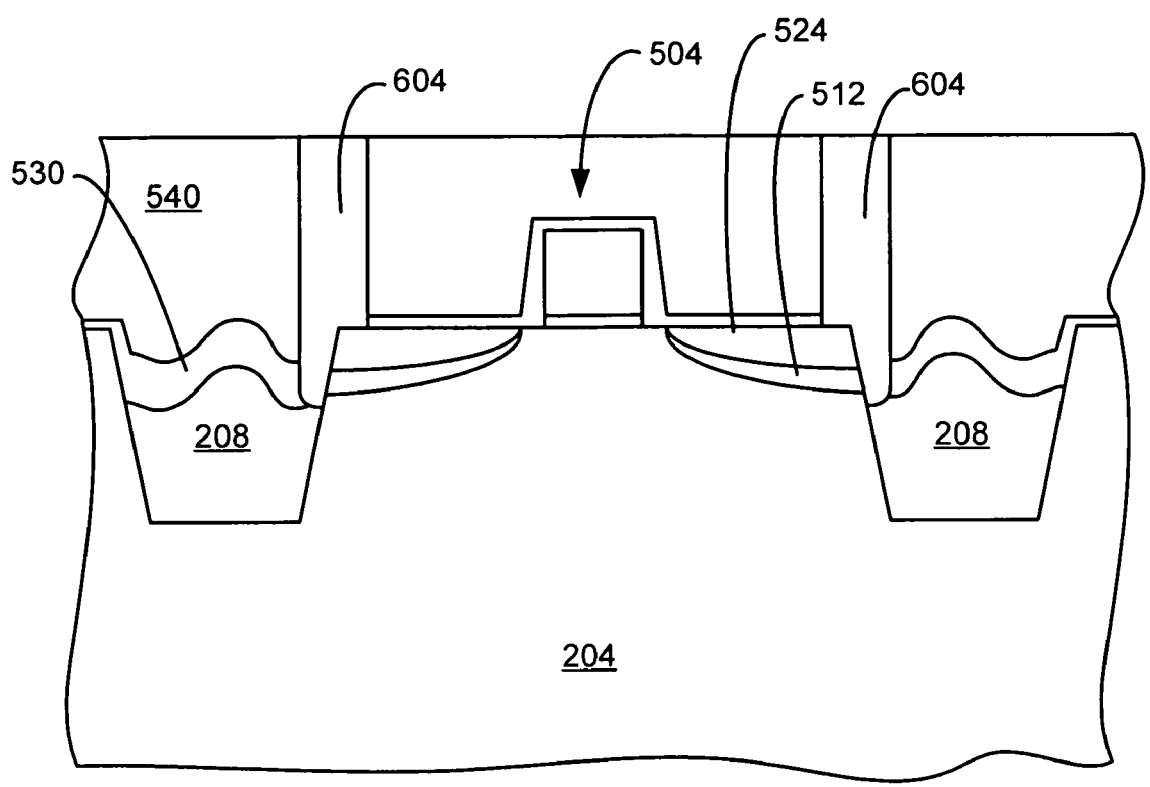
FIG. 6 is a schematic cross-sectional view of the substrate illustrated in FIG. 5 after contact holes have been formed.
Figure 7:
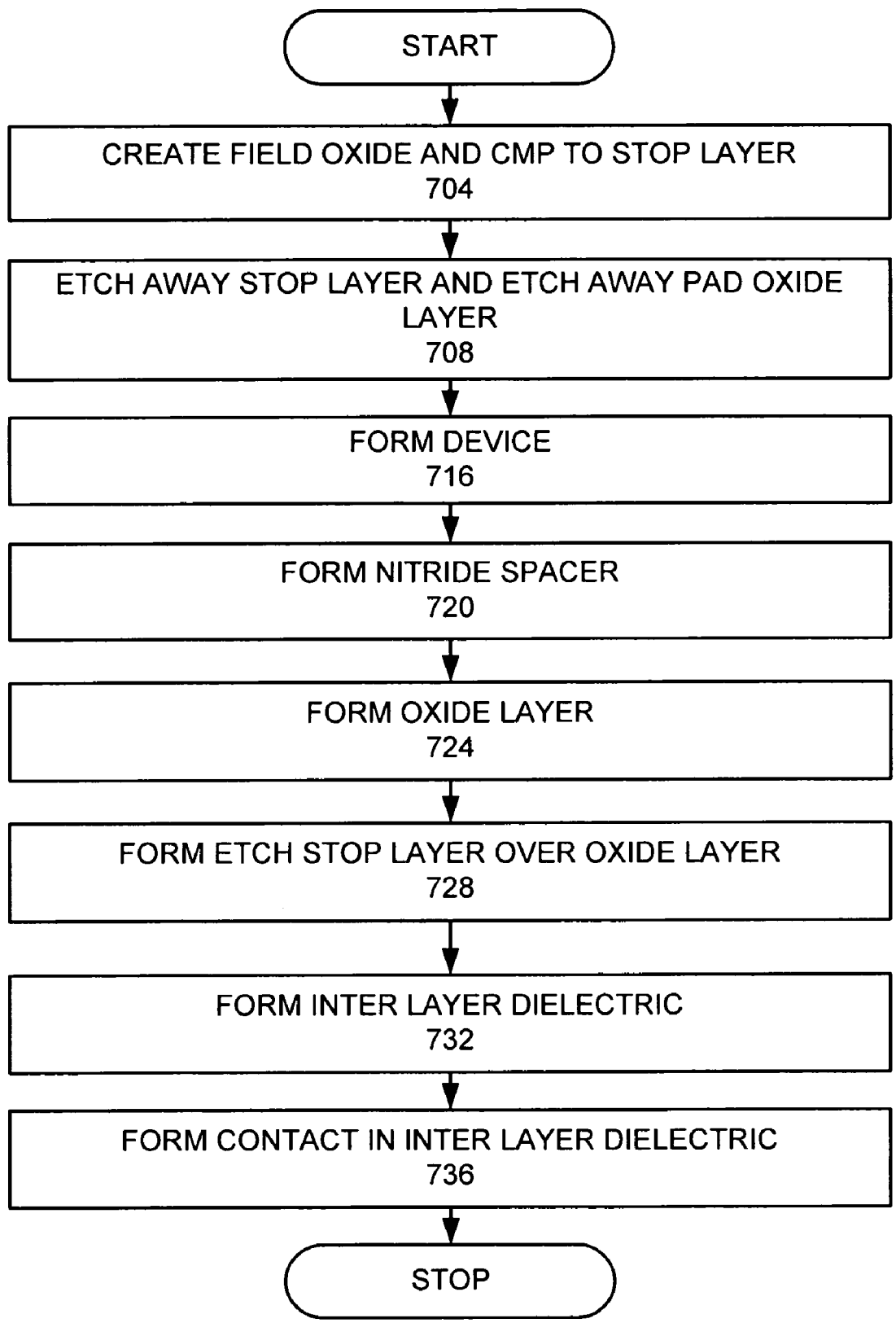
FIG. 7 is a flow chart of a process used in an embodiment of the invention.
Figure 8:
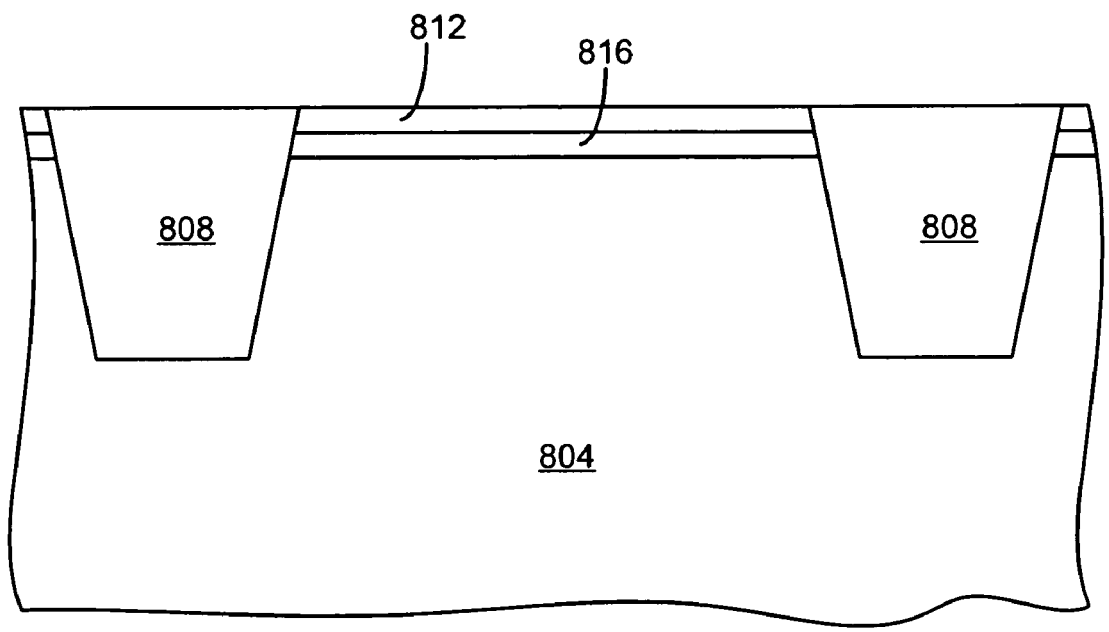
FIG. 8 is a schematic cross-sectional view of part of a substrate for a semiconductor chip with field oxides formed to provide shallow trench isolation in an embodiment of the invention.

FIG. 7 is a flow chart of a process used in an embodiment of the invention. FIG. 8 is a schematic cross-sectional view of part of a substrate 804 of a semiconductor chip with field oxides 808 formed to provide Shallow Trench Isolation (STI). Such a structure may be formed by providing an oxide layer 816 over the surface of the substrate. A nitride layer 812 is placed over the oxide layer 816 to provide an etch stop. The oxide layer 816, between the nitride layer 812 and the substrate 804, prevents damage to the substrate 804 by the nitride layer 812. Such protective oxide layers may be called pad oxide layers. Shallow trenches may then be etched into the substrate. Generally, a field oxide is deposited to fill the shallow trenches and then a Chemical Mechanical Polishing (CMP) is used to polish the surface so that excess FOX is removed, providing a flat surface as shown, using the nitride layer 812 as a stop for the polishing (step 704). The final height of the FOX may be >1000 Å above the substrate surface.

Figure 9:
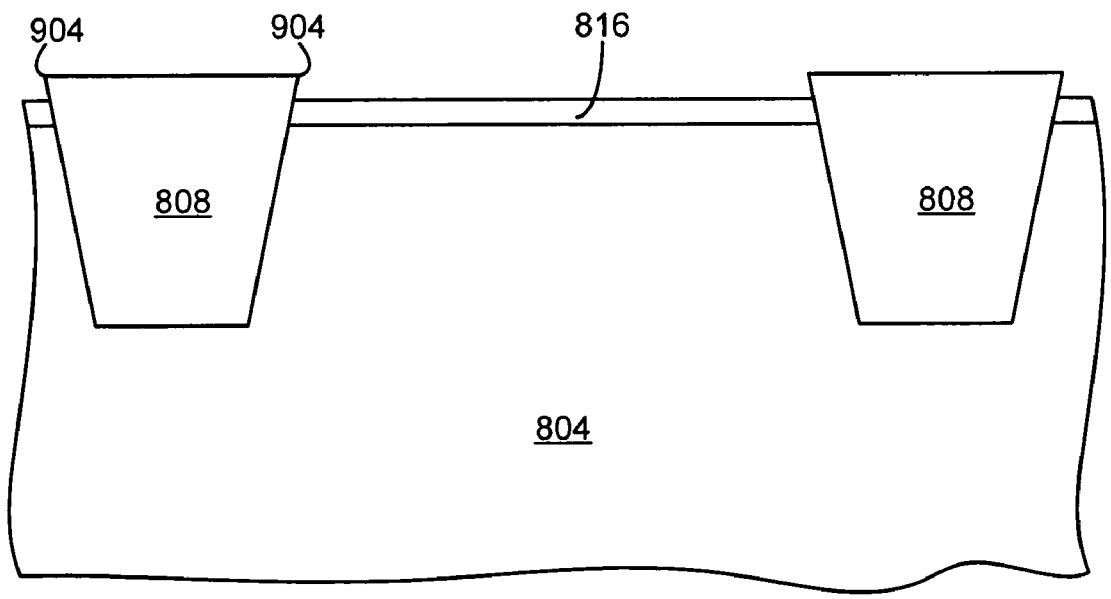
FIG. 9 is a schematic cross-sectional view of the substrate illustrated in FIG. 8 after a nitride layer has been etched away.
Figure 10:
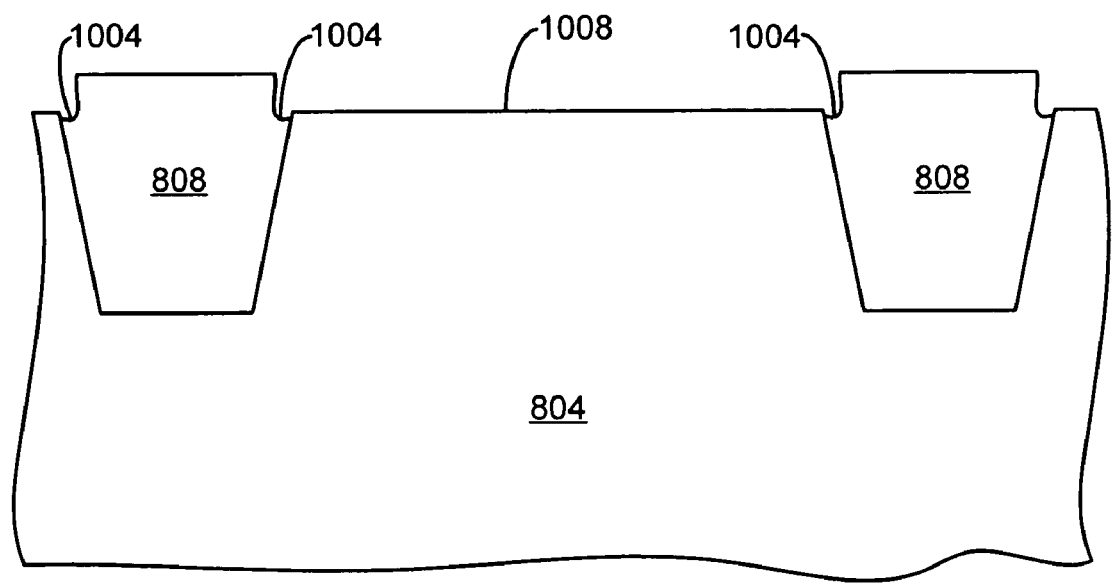
FIG. 10 is a schematic cross-sectional view of the substrate illustrated in FIG. 9 after an oxide layer has been etched away.

The nitride layer and the oxide layer 816 may then be etched away (step 708). This may be done in a two step process of first etching away the nitride layer and then etching away the oxide layer. Phosphoric acid may be used to remove the nitride layer. Such a wet etching may have a high selectivity between the nitride layer 812, the oxide layer 816, and the FOX 808. FIG. 9 is an illustration of the substrate in FIG. 8 after the nitride layer has been etch away. Due to the high selectivity, minimal amounts of oxide may be removed, providing negative angles 904 at the top of the FOX 808. A Hydrogen Fluoride (HF) wet etch may be used to remove the oxide layer 816, reduce the height of the FOX 808, and change the angle of the FOX 808 at a transistor active edge, by establishing a positive slope 1004, as shown in FIG. 10. The HF etch effectively moves the edges of the FOX back away from the transistor region.

Figure 11:
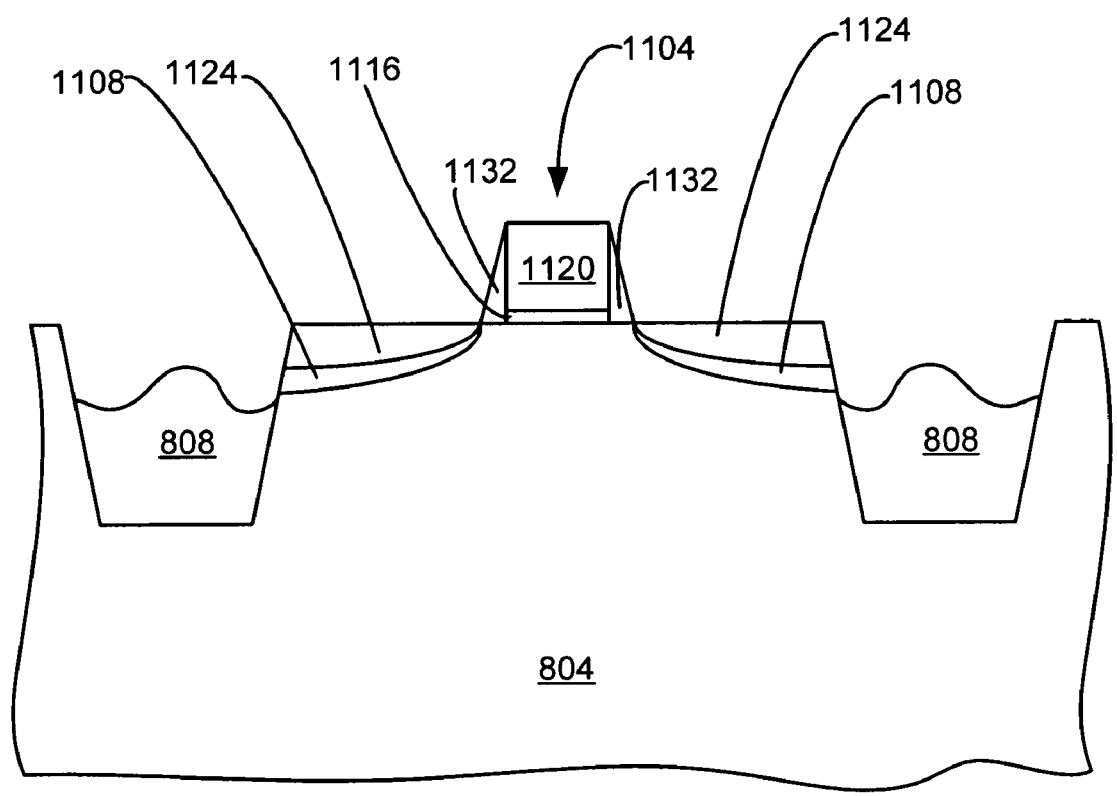
FIG. 11 is a schematic cross-sectional view of the substrate illustrated in FIG. 10 after a semiconductor device has been formed.

A semiconductor device may be formed in the transistor region 1008 between the FOXs 808 (step 716). An example of such a semiconductor device is illustrated in FIG. 11. In this example, the semiconductor device 1104 comprises a source and a drain 1108, a gate oxide 1116, a polysilicon gate 1120, and metal silicides 1124 for forming electrical contacts. The process of forming the semiconductor device may expose the FOX 808 to as many as ten wet etches, which may etch away part of the FOX 808 to the point of the top of the FOX 808 that is in contact with the implant areas forming the source and drain 1108. Such etchings may cause the transistor-FOX edge to recess as much as 1100 Å.

Figure 12:
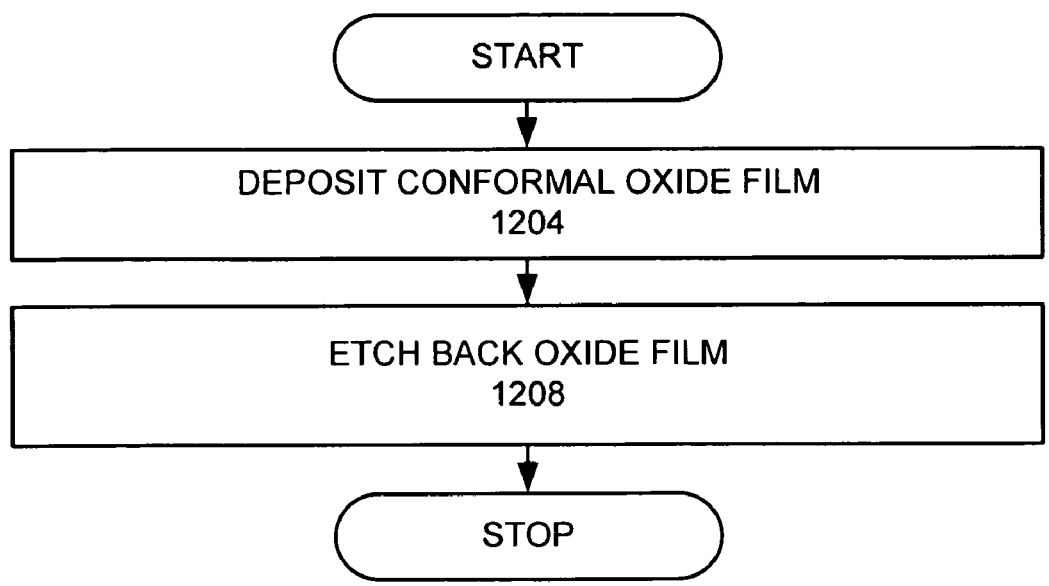
FIG. 12 is a more detailed flow chart of an oxide layer formation step.
Figure 13:
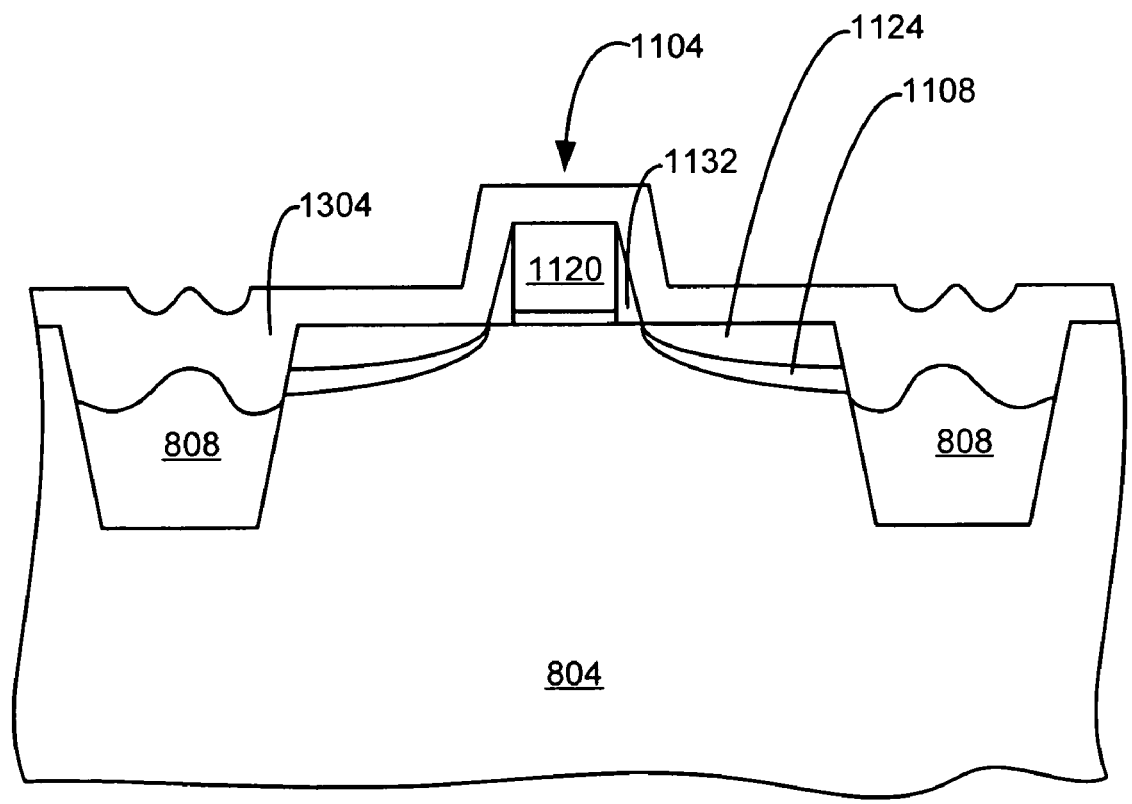
FIG. 13 is a schematic cross-sectional view of the substrate illustrated in FIG. 11 after a conformal oxide layer has been deposited.
Figure 14:
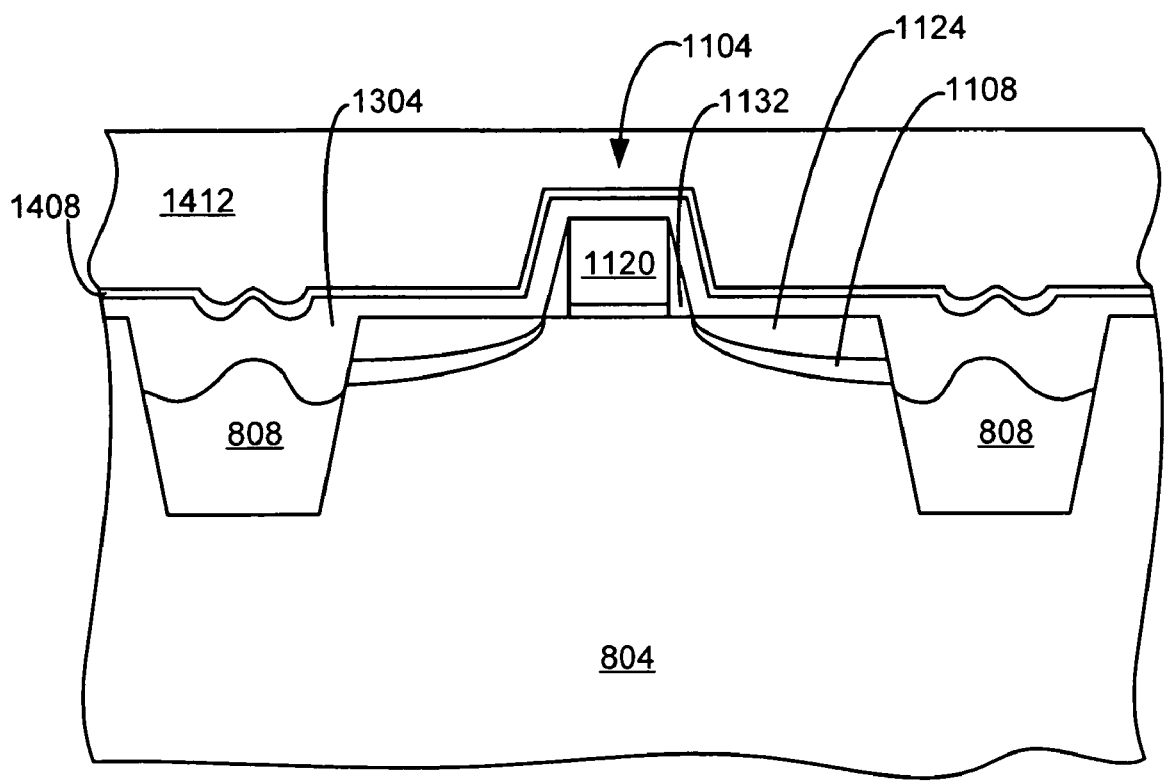
FIG. 14 is a schematic cross-sectional view of the substrate illustrated in FIG. 13 after an inter layer dielectric has been formed.

A Nitride (SiN) layer may be deposited and etched back to form nitride spacers 1132 on sidewalls of the polysilicon gate 1120 (step 720). The formation of the nitride spacers may further etch away part of the FOX 808. An oxide layer is formed over the surface of the FOX 808, semiconductor device 1104, and spacer 1132 (step 724). FIG. 12 is a more detailed flow chart of an embodiment of the oxide layer formation step 724. A conformal oxide film 1304 may be deposited over the surface of the FOX 808, semiconductor device 1104, and spacer 1132, as shown in FIG. 13 (step 1204). The conformal oxide film 1304 may be formed by Low Temperature Oxidation (LTO), or may be formed from Tetraethylorthosilane (TEOS) or Borophosphosilica Glass (BPSG) or any other electrically insulative silicon-oxide-based material. The conformal oxide film may be deposited to a thickness in a range of 100 Å to 3000 Å. More preferably, the conformal oxide is deposited to a thickness in the range of 800 Å to 1600 Å. The oxide film 1304 is then etched back, as shown in FIG. 14 (step 1208). The conformal oxide film 1304 may be etched back to a thickness in a range of 200 Å to 600 Å. More preferably, the conformal oxide is etched back to a thickness in the range of about 200 Å to 600 Å. Preferably, the etching is performed by an anisotropic etch. By providing a thicker conformal oxide layer and then performing an anisotropic etch, the FOX recesses may be reduced, providing a more planarized oxide layer. In addition, the etch back may not be required, if the initial deposition thickness is in the range of 200 Å to 600 Å. If the conformal oxide film 1304 is formed from BPSG, a thermal reflow step may be added to further planarize the oxide film.

An etch stop layer 1408 is placed over the conformal oxide film 1304 (step 728). Preferably, the etch stop layer 1408 is a deposited Silicon Nitride (SiN) barrier layer. An Inter Layer Dielectric (ILD) 1412 is formed over the etch stop layer 1408 (step 732). Preferably, the ILD 1412 is an oxide layer that is thermally densified and then a Chemical Mechanical Polishing (CMP) is used to provide a flat upper surface.

Figure 15:
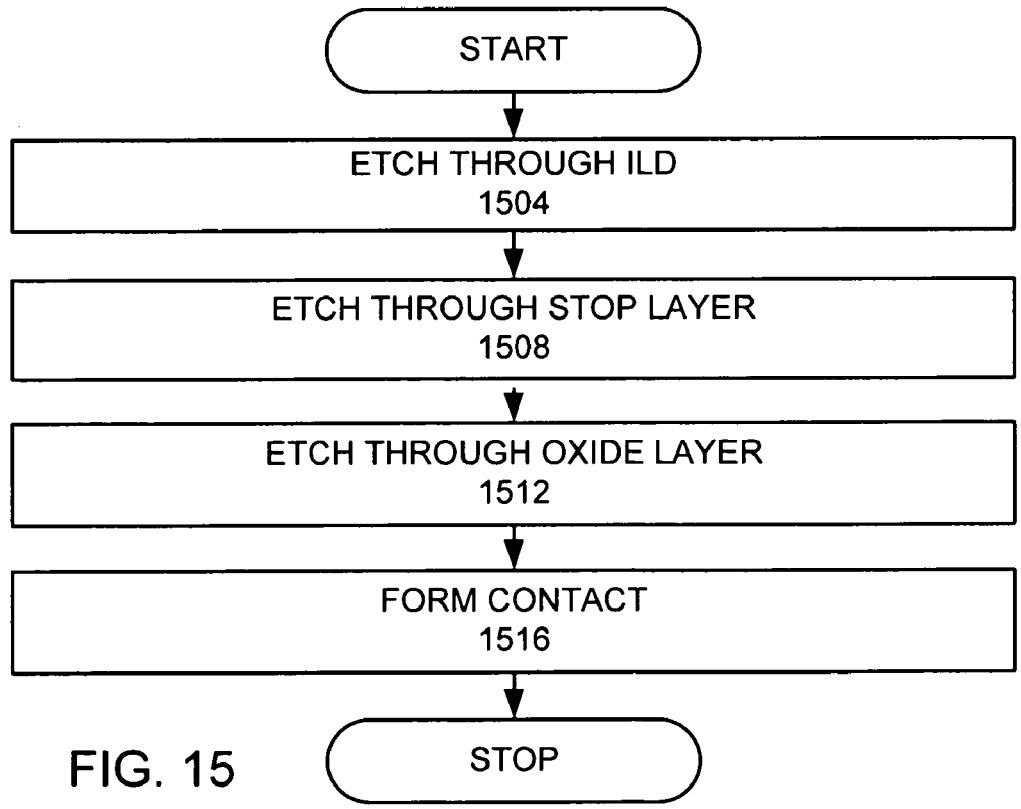
FIG. 15 is a more detailed flow chart of a contact forming step.
Figure 16:
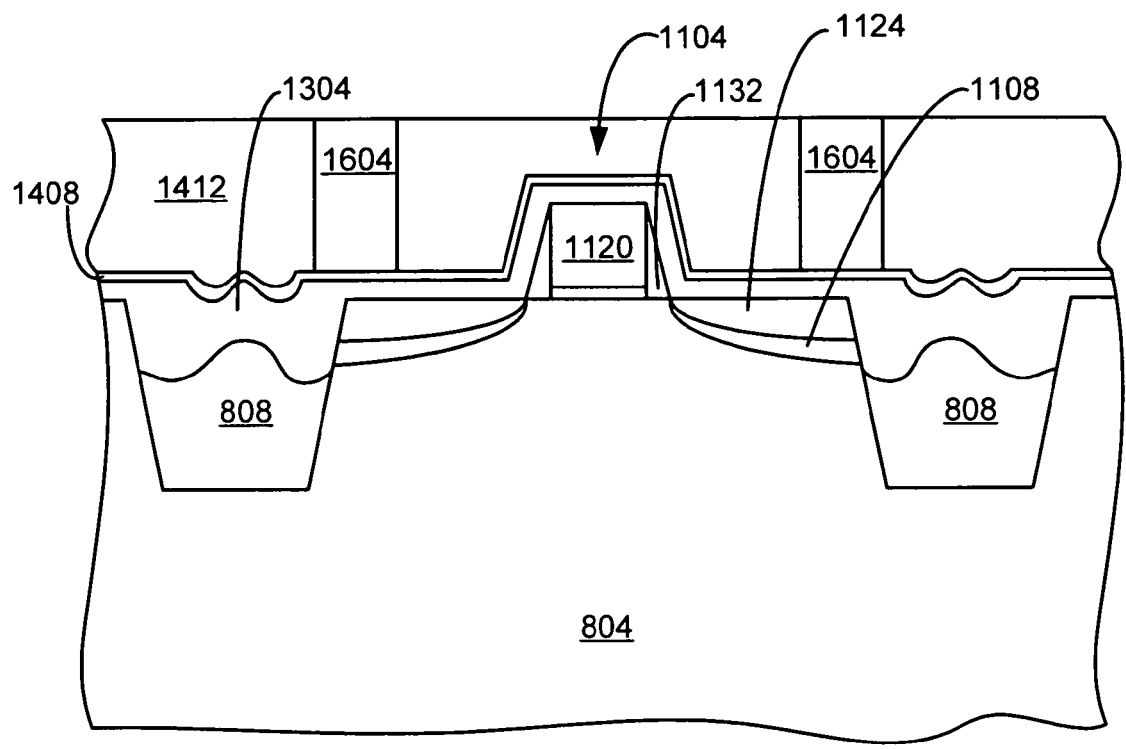
FIG. 16 is a schematic cross-sectional view of the substrate illustrated in FIG. 13 after contact holes have been etched through an inter layer dielectric.
Figure 17:
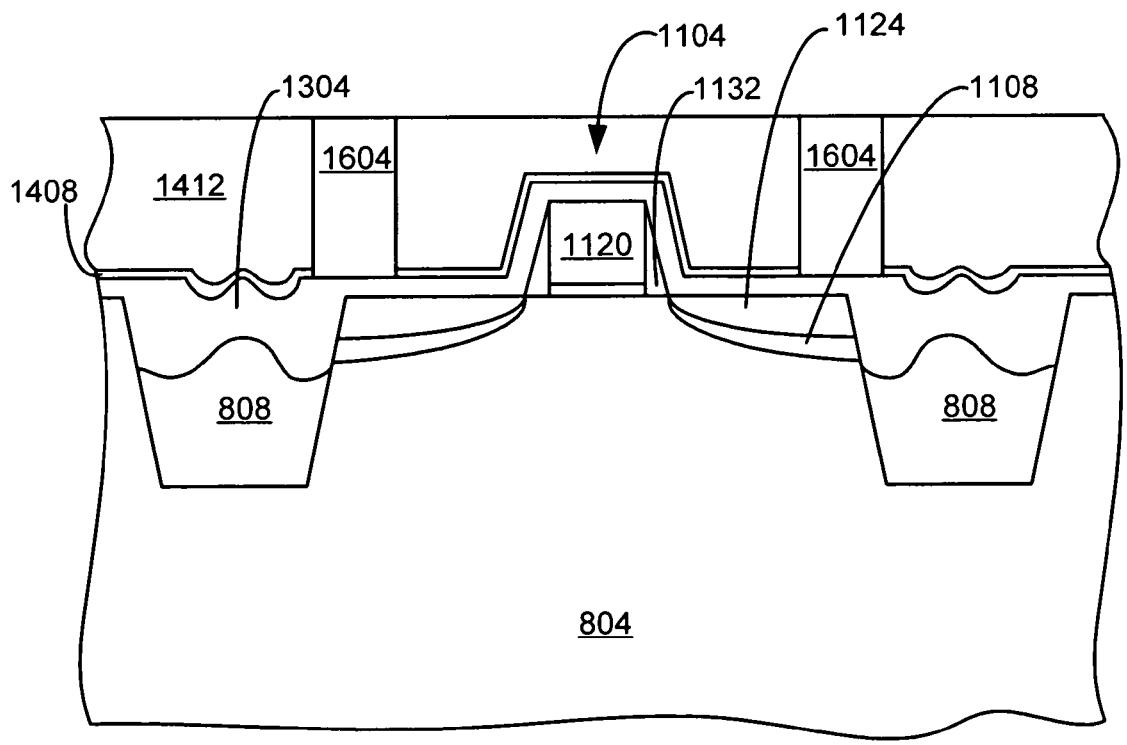
FIG. 17 is a schematic cross-sectional view of the substrate illustrated in FIG. 16 after the contact holes have been etched through a nitride layer.
Figure 18:
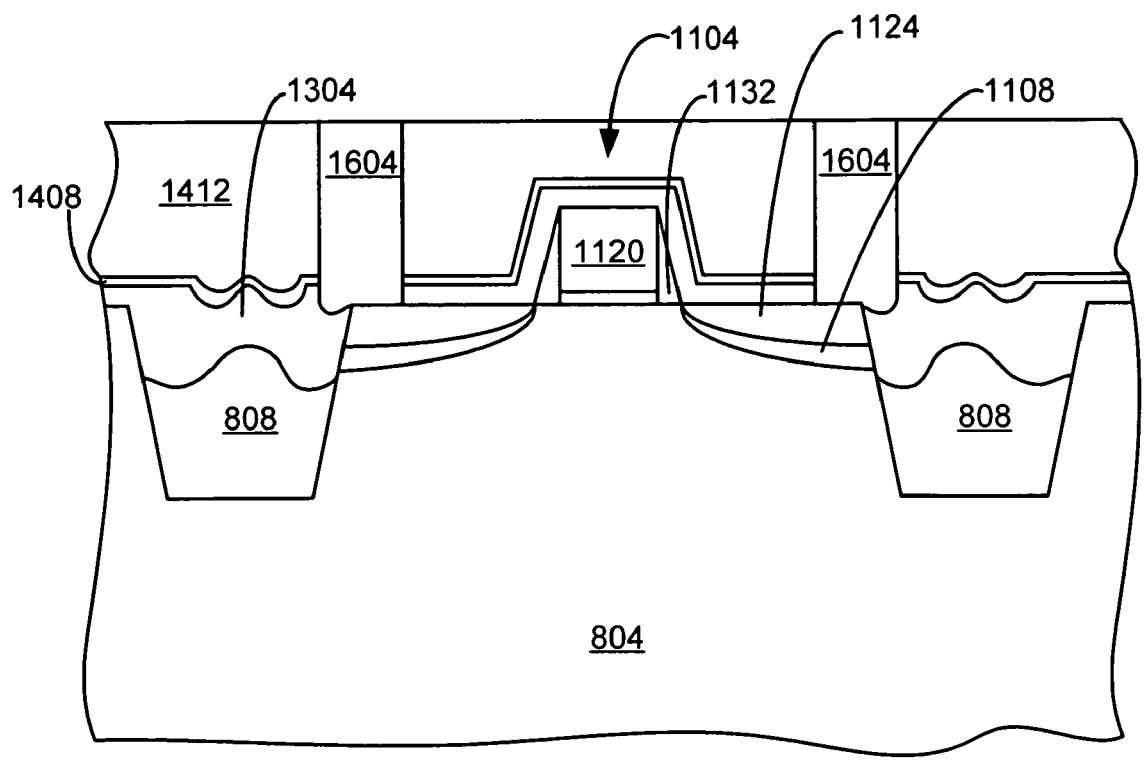
FIG. 18 is a schematic cross-sectional view of the substrate illustrated in FIG. 17 after contact holes have been etched at least partly through the conformal oxide layers.
Figure 19:
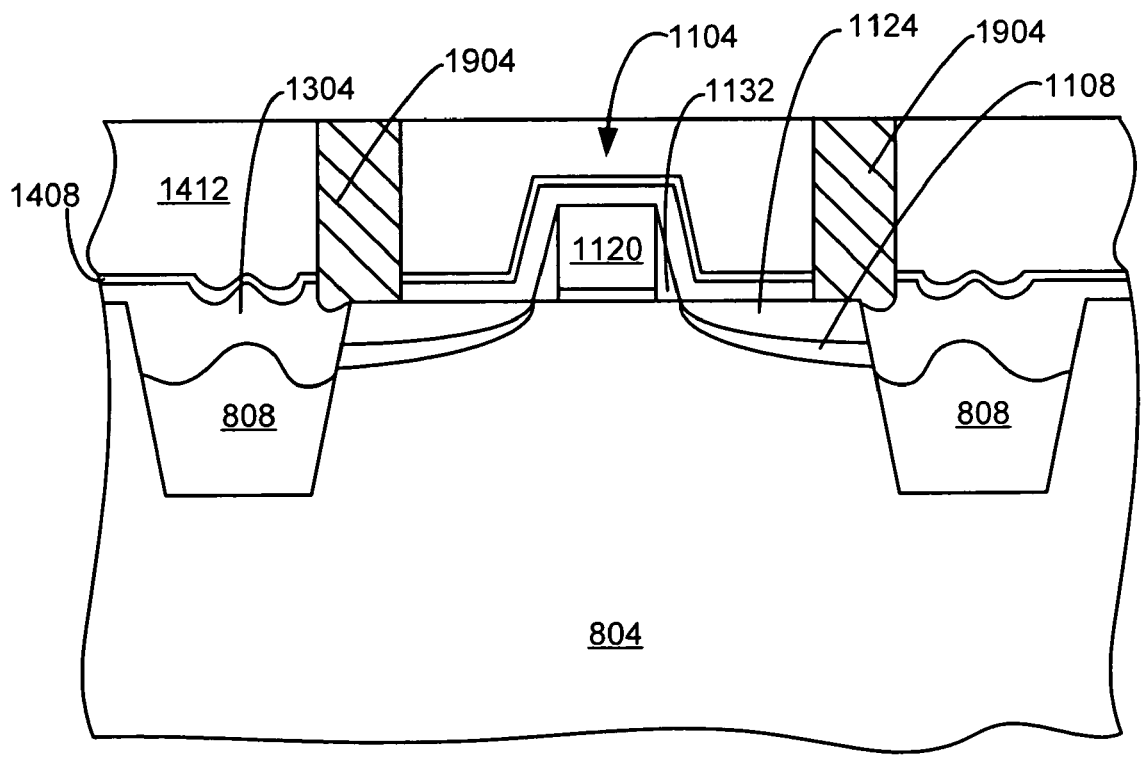
FIG. 19 is a schematic cross-sectional view of the substrate illustrated in FIG. 18 after electrically conductive material has been placed in the contact holes.

An electrically conductive contact is then formed in the ILD (step 736). FIG. 15 is a more detailed flow chart of the step of forming a contact in the ILD. A hole is etched into the ILD 1412 (step 1504). FIG. 16 is a schematic cross-sectional view after contact holes 1604 have been etched trough the ILD 1412. In a preferred embodiment, the holes in the ILD 1412 are etched using an isotropic etch with high selectivity of ILD to SiN. The etch stop layer 1408 may be used as an etch Stop for the contact etch of the ILD 1412. The contact etch chemistry is then changed to etch the etch stop layer 1408 (step 1508), which may use the conformal oxide film 1304 as an etch stop. In a preferred embodiment, the etch stop layer is etched using an anisotropic etch with high selectivity of SiN to SiO2. FIG. 17 is a schematic cross-sectional view after the contact holes 1604 have been etched through the etch stop layer 1408. The contact etch chemistry is ten changed again to etch into the oxide film 1304 (step 1512). Preferably, an anisotropic etch with a low etch rate for greater etch control is used to etch through the oxide film. FIG. 18 is a schematic cross-sectional view after the contact holes 1604 have been etched into the oxide film 1304. The contact etch etches through the oxide film to allow contact with the suicides 1124, but may etch just partially through the oxide film in some places, as shown. Contacts 1904 are formed by filling the contact holes with an electrically conductive material, as shown in FIG. 19 (step 1516). The electrically conductive material may be tungsten or other conductive materials. The resulting contacts are known as local interconnect (LI) or borderless contacts, which are partially above the FOX. A resulting semiconductor chip is formed from a plurality of the semiconductor devices 1104 using shallow trench isolation and borderless contacts.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A semiconductor chip, formed by the method comprising:
   creating shallow trenches containing field oxide on a substrate;
   forming at least one semiconductor device between the shallow trenches;
   etching away some of the field oxide in the shallow trenches to form field oxide recesses in the shallow trenches;
   forming an oxide layer over the at least one semiconductor device and the field oxide recesses, wherein the oxide layer reduces the field oxide recesses;
   forming an etch stop layer over the oxide layer;
   forming an inter layer dielectric layer over the etch stop layer;
   etching at least one contact hole through the inter layer dielectric layer, the etch stop layer, and at least partially through the oxide layer; and
   filling the at least one contact hole with a conductive material.

2. The semiconductor chip, as recited in claim 1, wherein the etching of the at least one contact hole is positioned to form a borderless contact.

3. The semiconductor chip, as recited in claim 2, wherein the etching at least one contact hole comprises:
   providing a first etch with a first etch chemistry to etch through the inter layer dielectric layer;
   providing a second etch with a second etch chemistry different than the first etch chemistry to etch through the etch stop layer; and
   providing a third etch with a third etch chemistry, different than the second etch chemistry to etch at least partially through the oxide layer.

4. The semiconductor chip, as recited in claim 3, wherein the forming of the oxide layer over the at least one semiconductor device comprises:
   forming a conformal oxide layer; and
   etching back the conformal oxide layer.

5. The semiconductor chip, as recited in claim 4, wherein the etching back the conformal oxide layer comprises etching with an anisotropic etch to make the conformal oxide layer thinner.

6. The semiconductor chip, as recited in claim 5, wherein the forming at least one semiconductor device comprises forming at least one gate structure, and further comprising forming sidewalls around the at least one gate structure.

7. The semiconductor chip, as recited in claim 6, wherein the creating of shallow trenches on a substrate comprises:
   providing a pad oxide layer over the substrate;
   providing a nitride layer over the pad oxide layer;
   forming shallow trenches;
   filling the shallow trenches with a field oxide;
   chemical and mechanical polishing a surface of the field oxide to the nitride layer;
   etching away the nitride layer; and
   etching away the pad oxide layer.

8. The semiconductor chip, as recited in claim 7, wherein the forming of the etch stop layer forms the etch stop from silicon nitride.

9. The semiconductor chip, as recited in claim 8, wherein the forming of the sidewalls forms the sidewalls from silicon nitride.

10. The semiconductor chip, as recited in claim 1, wherein the etching at least one contact hole comprises:
    providing a first etch with a first etch chemistry to etch through the inter layer dielectric layer;
    providing a second etch with a second etch chemistry different than the first etch chemistry to etch through the etch stop layer; and
    providing a third etch with a third etch chemistry, different than the second etch chemistry to etch at least partially through the oxide layer.

11. The semiconductor chip, as recited in claim 1, wherein the forming the oxide layer over the at least one semiconductor device comprises:
    forming a conformal oxide layer; and
    etching back the conformal oxide layer.

12. The semiconductor chip, as recited in claim 11, wherein the etching back the conformal oxide layer comprises etching with an anisotropic etch to make the conformal oxide layer thinner.

13. The semiconductor chip, as recited in claim 1, wherein the forming at least one semiconductor device comprises forming at least one gate structure, and further comprising forming sidewalls around the at least one gate structure.

14. The semiconductor chip, as recited in claim 13, wherein the forming of the sidewall forms the sidewalls from silicon nitride.

15. The semiconductor chip, as recited in claim 1, wherein the creating of shallow trenches on a substrate comprises:
    providing a pad oxide layer over the substrate;
    providing a nitride layer over the pad oxide layer;
    forming shallow trenches;
    filling the shallow trenches with a field oxide;
    chemical and mechanical polishing a surface of the field oxide to the nitride layer;
    etching away the nitride layer; and
    etching away the pad oxide layer.

* * * * *